(12) United States Patent
Jiang

(10) Patent No.: US 7,999,364 B2
(45) Date of Patent: Aug. 16, 2011

(54) METHOD AND FLIP CHIP STRUCTURE FOR POWER DEVICES

(75) Inventor: Hunt H. Jiang, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 469 days.

(21) Appl. No.: 11/835,247

(22) Filed: Aug. 7, 2007

(65) Prior Publication Data

US 2008/0048218 A1  Feb. 28, 2008

Related U.S. Application Data

(60) Provisional application No. 60/840,237, filed on Aug. 24, 2006.

(51) Int. Cl.
*H01L 23/495* (2006.01)

(52) U.S. Cl. . 257/676; 257/685; 257/723; 257/E23.031; 257/E23.044; 257/E23.052; 257/E29.345

(58) Field of Classification Search ............. 257/666, 257/778, 685–686, 777, 723, 731, 733, 782, 257/786, 787, E23.004, E23.043, E23.046, 257/E23.05; 438/108, 123, 612, 666, 112, 124, 127
See application file for complete search history.

(56) References Cited

U.S. PATENT DOCUMENTS

| | | | | |
|---|---|---|---|---|
| 5,677,567 A * | 10/1997 | Ma et al. | ............... | 257/666 |
| 6,563,366 B1 * | 5/2003 | Kohama | ............... | 327/382 |
| 6,710,441 B2 | 3/2004 | Eden et al. | | |
| 6,828,658 B2 * | 12/2004 | Schmitz et al. | .............. | 257/662 |
| 6,858,895 B2 | 2/2005 | Feldtkeller et al. | | |
| 6,940,189 B2 | 9/2005 | Gizara | | |
| 2003/0067058 A1 * | 4/2003 | Abe et al. | ............. | 257/666 |
| 2007/0262346 A1 * | 11/2007 | Otremba et al. | ............ | 257/177 |
| 2008/0035959 A1 | 2/2008 | Jiang | | |
| 2008/0048218 A1 | 2/2008 | Jiang | | |
| 2009/0096435 A1 | 4/2009 | Ueunten | | |

* cited by examiner

*Primary Examiner* — A. Sefer
*Assistant Examiner* — Dilinh P Nguyen
(74) *Attorney, Agent, or Firm* — Perkins Coie LLP

(57) ABSTRACT

A lead frame structure for supporting a semiconductor die is disclosed that includes at least two electrical leads each having a plurality of finger shaped structures unilaterally extending outward from the at least two electrical leads. The electrical leads are arranged so that the plurality of finger shaped structures forms inter-digital patterns where the semiconductor dies are bonded to the lead frame structure.

10 Claims, 7 Drawing Sheets

US 7,999,364 B2

METHOD AND FLIP CHIP STRUCTURE FOR POWER DEVICES

REFERENCE TO RELATED APPLICATION

This application claims the benefit of the filing date of U.S. provisional application Ser. No. 60/840,237, filed Aug. 24, 2006, and incorporated herein by reference.

FIELD OF THE INVENTION

The present invention relates generally to the field of integrated circuit packaging, and more particularly, to flip chip packaging.

BACKGROUND

In today's consumer electronics, such as liquid crystal displays (LCD), digital cameras, and laptop computers, etc., switch-mode voltage regulator integrated circuit devices (IC devices) are required to deliver a large amount of current and use very low supply voltage. However, large current is particularly sensitive to interconnection resistance. That is, power efficiency of an IC device is degraded because high conduction loss converts a large current into heat. There are three main areas in an integrated circuit device where interconnection resistance can be reduced: in the circuit package, in the component, and in the interconnects. Among them, the circuit package and the interconnects are the most important factors that contribute to high interconnection resistance. This is especially true when the ON drain to source resistance ($R_{DS(ON)}$) has decreased due to improvement in the semiconductor manufacturing process. Therefore, IC devices having high-power transistors that achieve low interconnection resistance is crucial to the performance and operability of today consumer electronics.

The conventional method of placing devices in parallel to reduce interconnection resistance results in larger package size. This is antithetical to the miniaturization trend of today's electronic devices. Furthermore, this conventional method necessitates interconnecting these parallel devices by wire bonding, thereby further introducing high interconnection resistance, parasitic resistance, and parasitic inductance to the integrated circuits. Other prior arts attempt to reduce interconnection resistance by using low resistance materials, such as gold or the like. However, this prior art method has only achieved limited results in carrying high current and it has high production costs. Yet other prior art aims to reduce interconnection resistance by using flip chip interconnection ball grid array (FC-BGA) techniques to interconnect the high power integrated circuit die to the lead frame. Still, this technique does not sufficiently reduce the interconnection resistance to enable an IC device to provide the large current required by today consumer electronics.

SUMMARY OF THE INVENTION

A lead frame structure is provided for supporting a semiconductor die that achieves low interconnection resistance and has the capability of handling high current. A lead frame structure is disclosed that includes at least two electrical leads each having a plurality of finger shaped structures that unilaterally extends outward from the electrical leads. The electrical leads are arranged so that the plurality of finger shaped structures forms inter-digital patterns where semiconductor dies are bonded to the lead frame structure.

A semiconductor device is provided that includes a plurality of semiconductor dies, each fabricated with an integrated circuit; a lead frame structure comprising at least two electrical leads each having a plurality of finger shaped structures that unilaterally extends outward from the electrical leads. The electrical leads are arranged in inter-digital patterns where the plurality of semiconductor dies are bonded to the lead frame structure. Finally, the semiconductor dies and the lead frame structure are encapsulated in a molding material so that the electrical leads are exposed to communicate with external circuitry.

A method is provided for fabricating a semiconductor flip chip device with the capability of carrying high current and having low interconnection resistance. The method includes providing semiconductor flip chip dies each having an integrated circuit electrically coupled to a plurality of flip chip bumps, providing a lead frame structure with a plurality of electrical leads each having a plurality of finger shaped metal structures extending unilaterally outward therefrom and arranged in inter-digital patterns where the semiconductor flip chip dies are flip chip bonded thereto, bonding the semiconductor flip chip dies to the lead frame structure, and encapsulating the lead frame structure and the semiconductor flip chip dies.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intend to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of the ordinary skill in the art that the present invention may be practiced without these specific details. In other instances, well-known methods, procedures, components, and circuits have not been described in detail so as not to unnecessarily obscure aspects of the present invention.

Figure 1A:
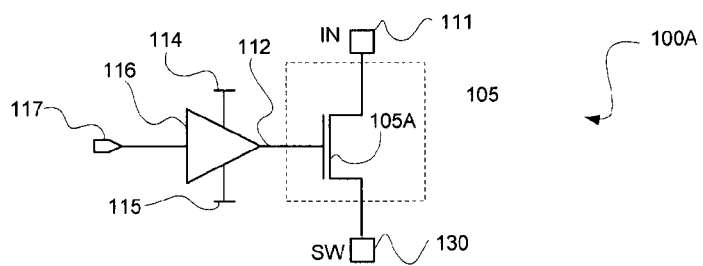
FIG. 1A illustrates a schematic diagram of an exemplary switch-mode voltage regulator circuit that includes a gate driver circuit electrically connected to turn on and off a Metal Oxide Semiconductor (MOS) transistor switch.

Now referring to FIG. 1A, a schematic diagram of an exemplary switch-mode voltage regulator circuit 100A including a gate driver circuit 116 and a switching device 105 is illustrated. In one embodiment, switching device 105 comprises a power Double Diffused Metal Oxide Semiconductor Field Effect transistor (DMOS) switch 105A. It is understood that switching device 105 can contain any semiconductor circuitry, which is within the scope of the present invention. More particularly, gate driver circuit 116 has an input terminal 117, a first supply voltage terminal ($V_{CC}$) 114, a second supply voltage terminal ($V_{EE}$) 115, and an output terminal 112. Output terminal 112 is connected to the gate of DMOS switch 105A. The source of DMOS switch 105OA forms a switch terminal (SW) 130. The drain of DMOS switch 105A is electrically connected to an input voltage terminal 111 that is adapted to receive an unregulated input voltage ($V_{IN}$).

Figure 1B:
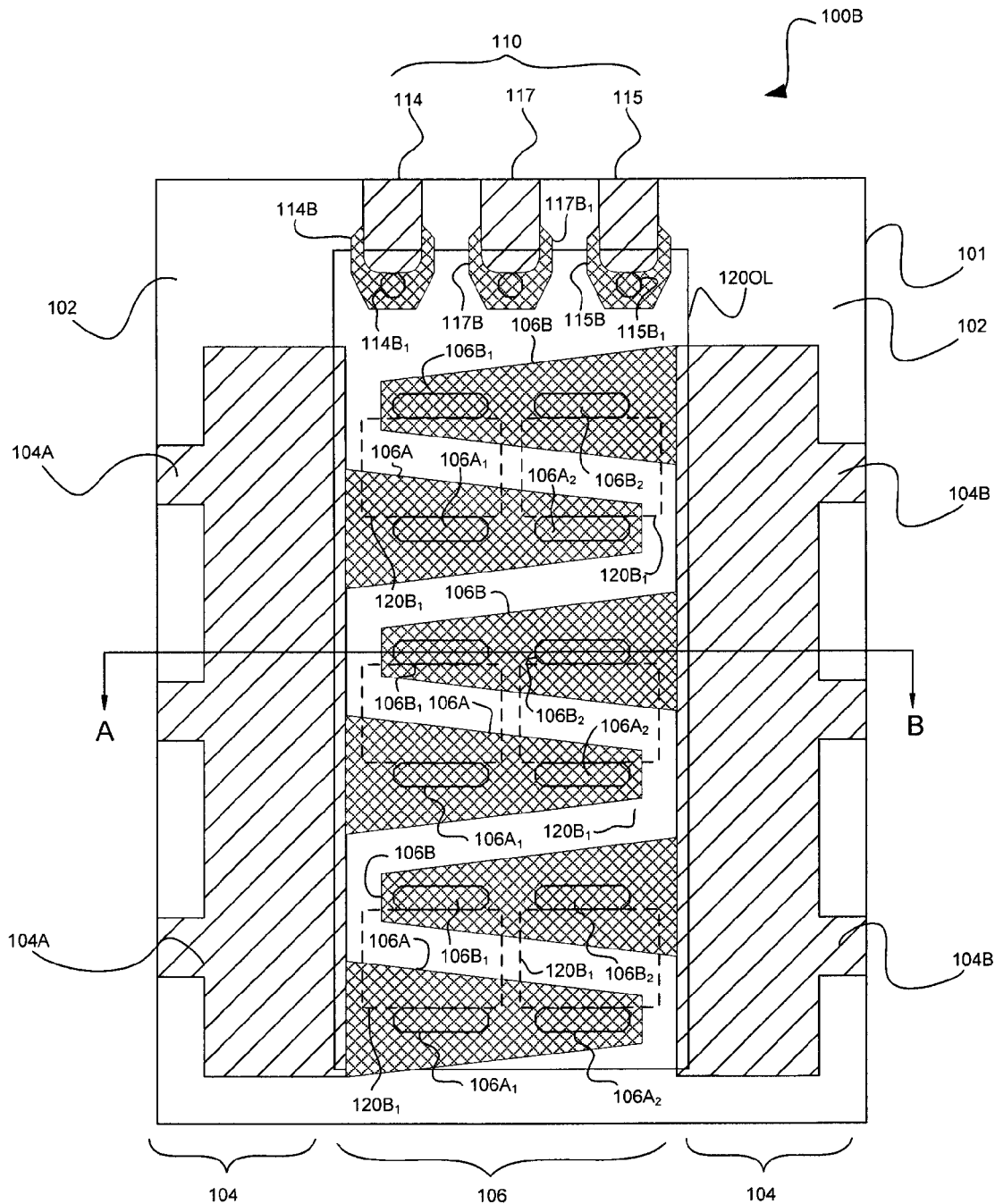
FIG. 1B illustrates a top plan view of a semiconductor device that includes a lead frame structure having at least two electrical leads each comprising a plurality of finger shaped structures that are arranged in inter-digital patterns where a semiconductor die fabricated with the exemplary switch-mode voltage regulator circuit of FIG. 1A is received in accordance with an embodiment with the present invention.

Reference is now made to FIG. 1B, a top plan view of a semiconductor device 100B that implements switch-mode voltage regulator circuit 100A and is capable of achieving low interconnection resistance and handling large current in accordance with an embodiment of the present invention. Semiconductor device 100B includes a lead frame structure 101 that is the metal 'skeleton' that provides both mechanical support and a means for electrical communication between a semiconductor die and external circuitry. In one embodiment of the present invention, lead frame structure 101 is one single metal frame made by any suitable method such as etching. Lead frame structure 101 includes at least two electrical leads 104 each having a plurality of finger shaped structures 106 that extends unilaterally outward from at least two electrical leads 104. At least two electrical leads 104 are arranged such that plurality of finger shaped structures 106 forms inter-digital patterns where semiconductor dies are bonded to lead frame structure 101. Semiconductor dies can be fabricated with switch-mode voltage regulator circuit 100A of FIG. 1A. A molding material 102 encapsulates semiconductor dies and lead frame structure 101 in such a manner that at least two electrical leads 104 are exposed so that switch-mode voltage regulator circuit 100A can communicate with external circuitry.

In the exemplary embodiment as shown in FIG. 1B, at least two electrical leads 104 further includes a first electrical lead 104A and a second electrical lead 104B which are represented by the hatched areas. Plurality of finger shaped structures 106 includes a first plurality of finger shaped structures 106A and a second plurality of finger shaped structure 106B which are represented by cross-hatched areas. First plurality of finger shaped structures 106A are coupled to and unilaterally extends outward from first electrical lead 104A. Similarly, second plurality of finger shaped structures 106B are coupled to and unilaterally extends outward from second electrical lead 104B. It is noted that the term "coupled" in the present invention means that, but not limited to, first plurality of finger shaped structures 106A and first electrical lead 104A are made from a single piece of metal. In the present invention, the term "coupled" also means that first electrical lead 104A and first plurality of finger shaped structures 106A can be mechanically attached together so that first plurality of finger shaped structures 106A extends unilaterally outward from first electrical lead 104A. The same definitions of "couple" are also applicable to second electrical lead 104B and second plurality of finger shaped structures 106B.

As shown in FIG. 1B and within lead frame structure 101, first electrical lead 104A is arranged on the left hand side (on the A side of the AB axis) so that first plurality of finger structures 106A is unilaterally extended outward to the right. Similarly, second electrical lead 104B is arranged on the right hand side (on the B side of the AB axis) and second plurality of finger shaped structures 106B are unilaterally extended outward to the left so that that first plurality of finger shaped structures 106A and second plurality of finger shaped structures 106B form an inter-digital pattern where a semiconductor die is attached to lead frame structure 101, thus creating a die outline 120DP.

Referring again to FIG. 1B, in one embodiment of the present invention, a semiconductor die that is attached to the lead frame structure comprises a semiconductor flip chip die 120 that includes flip chip bumps. It is understood that semiconductor flip chip die 120 containing any Metal Oxide Semiconductor (MOS) circuitry such as power Metal Oxide Semiconductor Field Effect Transistor (MOSFET), Double Diffused Metal Oxide Semiconductor (DMOS), etc. are within the scope of the present invention. Semiconductor flip chip die 120 can be fabricated with exemplary switch-mode voltage regulator circuit 100A of FIG. 1A. On first finger shaped structures 106A, bonding sites $106A_1$ and $106A_2$ are areas where flip chips bumps of semiconductor flip chip die 120 make electrical contacts with first finger shaped structures 106A. Similarly, on second finger shaped structures 106B, bonding sites $106B_1$ and $106B_2$ are the areas where flip chip bumps of a semiconductor flip chip die 120 make electrical contacts with second finger shaped structures 106B. Thus, semiconductor flip chip die 120 is electrically coupled to first electrical lead 104A and second electrical lead 104B. In one embodiment of the present invention, bonding sites $106A_1$-$106A_2$, $106B_1$-$106B_2$ are electrical contacts of copper pillar bumps. In another embodiment of the present invention, it is understood that bonding sites $106A_1$-$106A_2$, $106B_1$-$106B_2$ can be electrical contacts of solder bumps. In the present invention, the terminology "flip chip attach" or "flip chip connect", or "flip chip contacts" means that a semiconductor flip chip die 120 is flipped over face down and bonded with lead frame structure 101 by means of flip chip bumps on bonding sites $106A_1$-$106A_2$, and $106B_1$-$106B_2$.

Continuing with FIG. 1B, semiconductor flip chip die 120 includes a gate electrode, a drain electrode, and a source electrode that are electrically coupled to first electrical lead 104A and second electrical lead 104B. In one embodiment of the present invention, semiconductor flip chip die 120 may include an array of switching elements which are represented by one or more transistor banks 120B$_1$. Each transistor bank 120B$_1$ is composed of a plurality of discrete Double Diffused Metal Oxide Semiconductor (DMOS) transistors that are laid out successively and parallel to one another in a continuous drain-gate-source pattern. When semiconductor flip chip die 120 is inverted face down, the drain electrodes are electrically coupled to first electrical lead 104A by means of bonding sites 106A$_1$-106A$_2$ on first plurality of finger shaped structures 106A. Thus, first plurality of finger shaped structures 106A operates as a means to distribute input voltage (V$_{IN}$) to all transistor banks 120B$_1$.

An external circuit (e.g., a battery) which makes electrical contact to first electrical lead 104A will be coupled to the drain electrodes. Next, the source electrodes are electrically coupled to second electrical lead 104B by means of bonding sites 106B$_1$-106B$_2$ on second plurality of finger shaped structures 106B. Thus, second plurality of finger shaped structures 106B is operable to sum up all the currents from transistor banks 120B$_1$. Any external circuitry, e.g. output filter, which makes electrical contacts with second electrical lead 104B will be electrically coupled to receive the sum of currents from all transistor banks 120B$_1$.

Continuing again with FIG. 1B, in one embodiment of the present invention, lead frame structure 101 also includes a set of input/output (I/O) electrical leads 110 that includes three separate electrical leads 114, 117, and 115. Electrical lead 117 is a single piece of metal that includes an electrical contact pad 117B. A drive signal (DRV) is provided to semiconductor flip chip die 120 at electrical lead 117. On electrical contact pad 117, represented by a cross-hatched polygonal area, where semiconductor flip chip die 120 makes electrical contact with lead frame structure 101 on a bonding site 117B$_1$. Specifically, semiconductor flip chip die 120 includes a signal bus spanning substantially across the whole die and making electrical contact with bonding site 117B$_1$. Thus, semiconductor flip chip die 120 is provided with drive signal (DRV). Similarly, electrical lead 114 is a single piece of metal that connects to an electrical contact pad 114. A supply voltage (V$_{CC}$) is provided to semiconductor flip chip die at electrical lead 114. On electrical contact pad 114, represented by a cross-hatched polygonal area, where semiconductor flip chip die 120 makes electrical contact with lead frame structure 101 on a bonding site 114B$_1$. Specifically, semiconductor flip chip die 120 includes a supply voltage (V$_{CC}$) bus line spanning substantially across semiconductor die and making electrical contact with bonding site 114B$_1$. Thus, semiconductor flip chip die 120 is provided with first supply voltage (V$_{CC}$). Finally, electrical lead 115 is a single piece of metal that connects to an electrical contact pad 115B. A second supply voltage (V$_{EE}$) is provided to semiconductor flip chip die 120 at electrical lead 115. On electrical contact pad 115B, represented by a cross-hatched polygonal area, where semiconductor flip chip die 120 makes electrical contact with lead frame structure 101 on a bonding site 115B$_1$. Specifically, semiconductor flip chip die 120 includes a second supply voltage (V$_{EE}$) bus line spanning substantially across the whole die and making electrical contact with bonding site 115B$_1$. Thus, semiconductor flip chip die 120 is provided with second supply voltage (V$_{EE}$).

Figure 2:
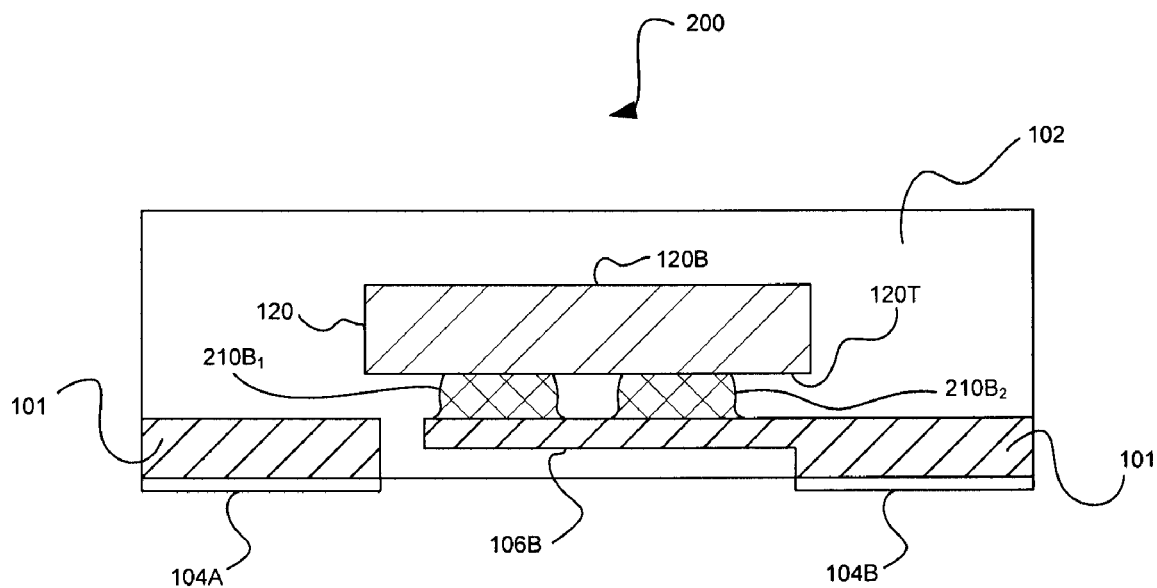
FIG. 2 illustrates cross-sectional view taken along the AB axis of the lead frame structure of FIG. 1B in accordance with an embodiment of the present invention.

Now referring to FIG. 2, an exemplary semiconductor flip chip device 200 is shown from a cross-sectional view from AB axis of semiconductor device 100B of FIG. 1. As shown, along the AB axis are first electrical leads 104A, second electrical leads 104B, and second plurality of finger shaped structures 106B with an exemplary semiconductor flip chip die 120 that is flip chip attached. On the top surface of second plurality of finger shaped structure 106B, semiconductor flip chip die 120 includes a top surface 120T and a bottom surface 120B. Semiconductor flip chip die 120 is inverted with top surface 120T faced down toward second plurality of finger shaped structures 104B. Flip chip bumps 210B$_1$ and 210B$_2$ couple semiconductor flip chip die 120 to second electrical lead 104B on bonding sites 106B$_1$ and 106B$_2$. After semiconductor flip chip die 120 is flip chip attached to lead frame structure 101, the entire assembly is encapsulated by a molding material 102 such as plastic or the likes.

Figure 3:
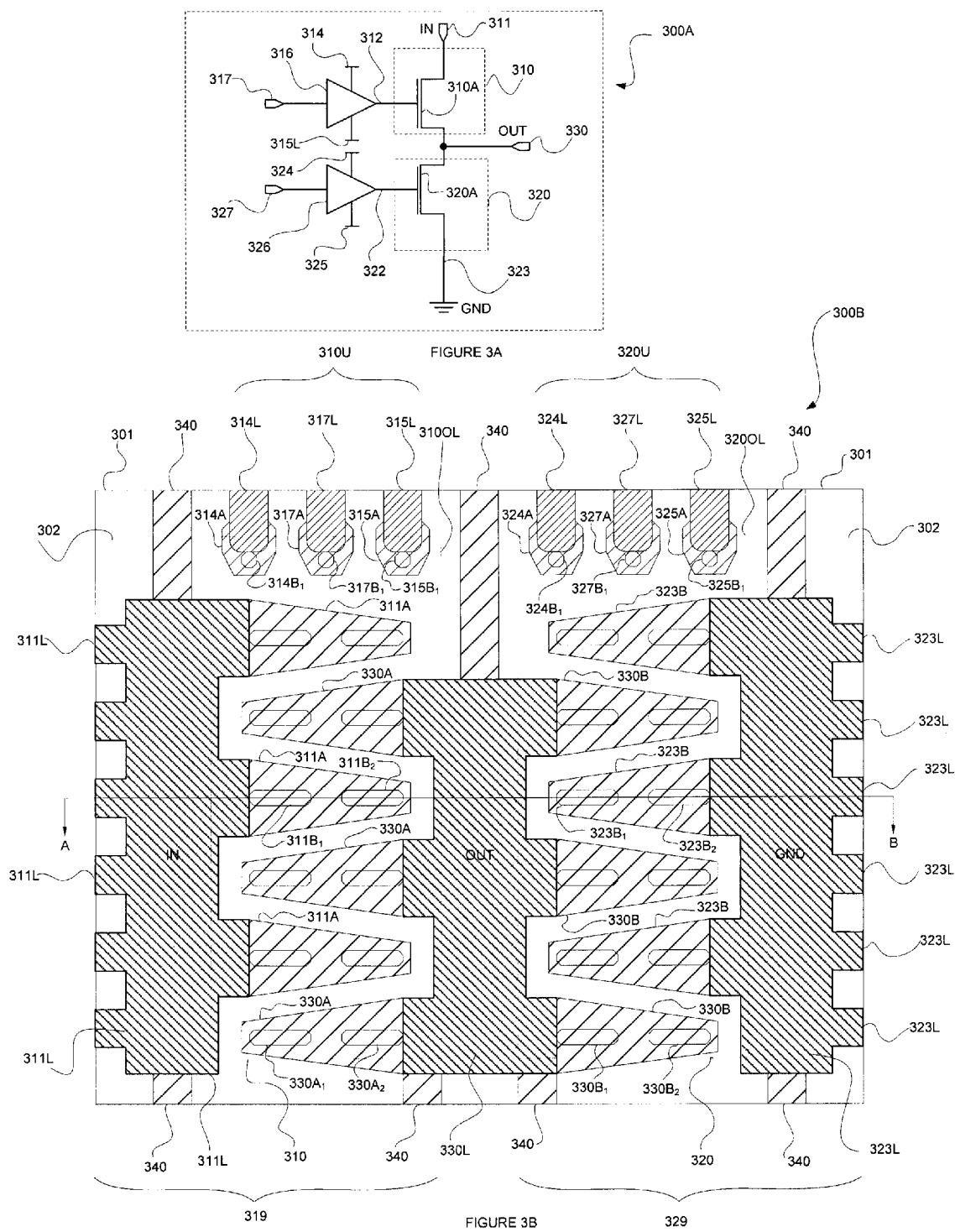
FIG. 3A illustrates a schematic diagram of an exemplary switch-mode voltage regulator circuit where each switch has its own corresponding gate driver circuit.
FIG. 3B illustrates the top plan view of an exemplary semiconductor device having a dual-die lead frame structure configuration that supports the switch-mode voltage regulator circuit of FIG. 3A in accordance with an embodiment with the present invention.

FIGS. 3A and 3B show an exemplary flip chip integrated circuit that contains two semiconductor dies and their dedicated gate driver circuits in according to an embodiment of the present invention. Now referring to FIG. 3A, a schematic diagram of an exemplary switch-mode voltage regulator circuit 300A including a first semiconductor die 310 and a second semiconductor die 320 is illustrated. In one embodiment, first semiconductor die 310 comprises a high-side power Double Diffused Metal Oxide Field Effect Transistor (DMOS) switch 310A and second semiconductor die 320 comprises a low-side power Double Diffused Metal Oxide Field Effect Transistor (DMOS) switch 320A. It is understood that first semiconductor die 310 and second semiconductor die 320 can contain any semiconductor circuitry, which is within the scope of the present invention. According to an embodiment of the present invention, high-side DMOS switch 310A is connected in series with a low-side DMOS switch 320A at the source-drain junction. That is, a first gate driver circuit 316 is connected to drive high-side DMOS switch 310A and a second gate driver circuit 326 is connected to drive low-side DMOS switch 320A. More particularly, first gate driver circuit 316 has an input terminal 317, a first supply voltage terminal 314 (V$_{CC}$), a second supply voltage terminal 315 (V$_{EE}$), and an output terminal 312. Output terminal 312 is connected to the gate of high-side DMOS switch 310A. The source of high-side DMOS switch 310A is connected to the drain of high-side DMOS switch 320A to form a switch terminal (SW) 330. The drain of high-side DMOS switch 310A is electrically connected to input terminal 311 that is adapted to receive an unregulated input voltage (V$_{IN}$). Second gate driver circuit 326 includes an input terminal 327, a first supply voltage terminal 324 (V$_{CC}$), a second supply voltage terminal 325 (V$_{EE}$), and an output terminal 322.

Output terminal 322 is connected to the gate of low-side DMOS switch 320A. The source of low-side DMOS switch 320A is connected to an electrical ground terminal (GND) 323. Electrical ground terminal (GND) 323 is, in turn, electrically connected to electrical ground 110. In this configuration, first gate driver circuit 316 is dedicated to drive high-side DMOS switch 310A; while, second gate driver circuit 326 is dedicated to drive low-side DMOS switch 320A. In one embodiment, first gate driver circuit 316 and second gate driver circuit 326 are fully integrated onto the same semiconductor die as high-side DMOS switch 310A and low-side DMOS switch 320A respectively.

FIG. 3B shows the plan view of an embodiment of an exemplary flip chip integrated circuit (IC) 300B that implements switch-mode voltage regulator circuit 300A of FIG. 3A in accordance with an embodiment of the present invention. As shown in FIG. 3B, flip chip integrated circuit 300B includes a lead frame structure 301 adapted to support high-side DMOS switch 310A and low-side DMOS switch 320A, all being encapsulated by a molding material 302. Lead frame structure 301 is the metal 'skeleton' that provides both mechanical support and a means for electrical communication between high-side DMOS switch 310A and low-side DMOS switch 320A and other circuitry such as first gate driver circuit 316 and second gate driver circuit 326. In one embodiment of the present invention, lead frame structure 301 is one single metal frame that includes a first section 319 for supporting high-side DMOS switch 310A and a second section 329 for supporting low-side DMOS switch 320A. It is understood that lead frame structure 301 capable of supporting a single DMOS die having high-side DMOS switch 310A, low-side DMOS switch 320A, and other peripheral circuitry are within the scope of the present invention.

Continuing with FIG. 3B, first section 319 further includes a first electrical lead 311L, a first plurality of finger shaped structures 311A, a second electrical lead 330L, a second plurality of finger shaped structures 330A, and a set of input/output (I/O) electrical leads 310U. As shown in FIG. 3B, first electrical lead 311L is arranged on the left hand side of lead frame structure 301 (on the A side of the AB axis) so that first plurality of finger shaped structures 311A is unilaterally extended to the right. Second electrical lead 330L is arranged in the middle of lead frame structure 301 so that second plurality of finger shaped structures 330A is extended unilaterally to the left. In such configuration, first plurality of finger shaped structures 311A and second plurality of finger shaped structures 330A form an inter-digital pattern that receives high-side DMOS switch 310A whereby an outline 310OL is formed. Outline 310OL is the location where high-side DMOS switch 310A is bonded to first electrical lead 311A and second electrical lead 330A on the inter-digital pattern. On first plurality of finger shaped structures 311L, there are bonding sites $311B_1$ and $311B_2$ which are the areas where the flip chip bumps of high-side DMOS switch 310A make electrical contacts to first electrical lead 311L. Similarly, on second plurality of finger shaped structures 330A, there are bonding sites $330A_1$ and $330A_2$ which are the areas where the flip chip bumps of high-side DMOS switch 310A are bonded to first electrical lead 311L and second electrical lead 330L.

Referring again to FIG. 3B, input/output (I/O) electrical leads 310U includes electrical leads 317L, 314L, and 315L adapted to provide input and output signals such as supply voltages and drive signal (DRV) to high-side DMOS switch 310A. Electrical lead 317L is adapted to receive a drive signal (DRV). Electrical lead 317L is a single metal that also includes an electrical contact pad 317A. Electrical contact pad 317A, represented by a cross-hatched polygonal area, includes a bonding site $317B_1$ where high-side DMOS switch 310A makes contact to electrical lead 317. In one embodiment, high-side DMOS switch 310A includes a signal bus line that is electrically coupled to bonding site $317B_1$. As a consequence, electrical lead 317L provides a drive signal (DRV) to first gate driver circuit 316. Similarly, electrical lead 314L is adapted to receive first supply voltage ($V_{CC}$). Electrical lead 314L is a single piece of metal that includes an electrical contact pad 314A. Electrical contact pad 314A, represented by a cross-hatched polygonal area, includes a bonding site $314B_1$ where high-side DMOS switch 310A makes electrical contact with electrical contact pad 314A. As a result, first supply voltage ($V_{CC}$) 314 of high-side DMOS switch 310A is supplied to first gate driver circuit 316. In the same vein, electrical lead 315L is exposed to receive second supply voltage ($V_{EE}$). Electrical lead 315L is a single piece of metal that includes an electrical contact pad 315A. Electrical contact pad 315A, represented by a cross-hatched polygonal area, includes a bonding site $315B_1$ where high-side DMOS switch 310A makes contact to electrical contact pad 315A. As a result, high-side DMOS switch 310A is also connected to receive second supply voltage ($V_{EE}$).

Continuing with FIG. 3B, second section 329 includes a portion of second electrical lead 330L, a third plurality of finger shaped structures 330B, fourth electrical lead 323L, a fourth plurality of finger shaped structures 323B, and a set of input/output (I/O) electrical leads 320U. As shown in FIG. 3B, second electrical lead 330L is arranged in the middle of lead frame structure 301 so that third plurality of finger shaped structures 330B is unilaterally extended to the right. Third electrical lead 323L is arranged on the far right so that fourth plurality of finger shaped structures 323B is extended unilaterally to the left. In such arrangement, second electrical lead 330L and third electrical lead 323L are arranged so that third plurality of finger shaped structures 321B and fourth plurality of finger shaped structures 323B form an inter-digital pattern where low-side DMOS switch 320A is bonded to second electrical lead 330L and third electrical lead 323L whereby an outline 320OL of low-side DMOS switch 320A is formed. On each of third plurality of finger shaped structures 330B there are bonding sites $330B_1$ and $330B_2$ where flip chip bumps of low-side DMOS switch 320A make contacts with third plurality of finger shaped structures 330B. Similarly, on each of fourth plurality of finger shaped structures 323B there are bonding sites $323B_1$ and $323B_2$ where flip chip bumps of low-side DMOS switch 320 make contacts with fourth plurality of finger shaped structures 323B.

Still referring to FIG. 3B, input/output (I/O) electrical leads 320U includes electrical leads 327L, 324L, and 325L adapted to provide supply voltages and drive signal (DRV) to low-side DMOS switch 320A. Electrical lead 327L is adapted to receive a drive signal (DRV). Electrical lead 327L is a single metal that also includes an electrical contact pad 327A. Electrical contact pad 327A, represented by a cross-hatched polygonal area, includes a bonding site $327B_1$ where low-side DMOS switch 320A makes contact to electrical lead 327. In one embodiment, low-side DMOS switch 320A includes a driving signal metal bus that is electrically coupled to bonding site $327B_1$. As a consequence, electrical lead 327L provides a drive signal (DRV) to second gate driver circuit 326. Similarly, electrical lead 324L is adapted to receive first supply voltage ($V_{CC}$). Structurally, electrical lead 324L is a single piece of metal that includes an electrical contact pad 324A. Electrical contact pad 324A, represented by a cross-hatched polygonal area, includes a bonding site $324B_1$ where low-side DMOS switch 320A makes contact with electrical contact pad 324A. As a result, first supply voltage ($V_{CC}$) 324 of low-side DMOS switch 320A is supplied to second gate driver circuit 326. In the same vein, electrical lead 325L is exposed to receive second supply voltage ($V_{EE}$). Electrical lead 325L is a single piece of metal that includes an electrical contact pad 325A. Electrical contact pad 325A, represented by a cross-hatched polygonal area, includes a bonding site $325B_1$ where low-side DMOS switch 320A makes contact to electrical contact pad 325A. As a result, low-side DMOS switch 320A is also connected to receive second supply voltage ($V_{EE}$).

Figure 4:
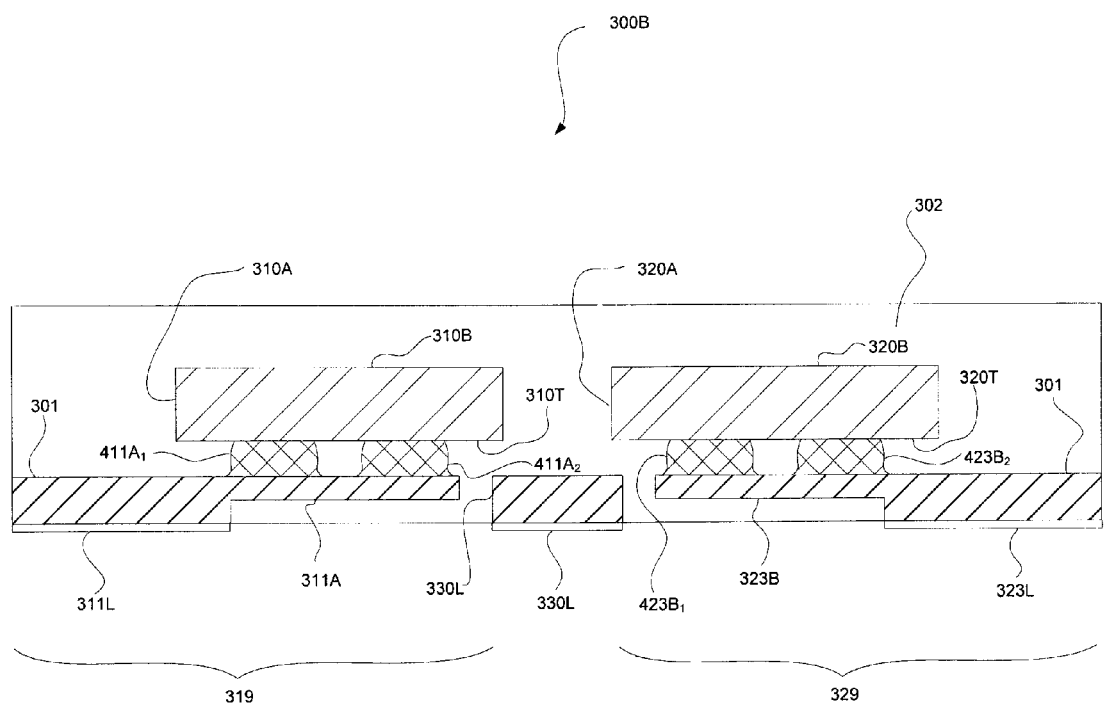
FIG. 4 illustrates a cross-sectional taken along the AB axis of the semiconductor device of FIG. 3B in accordance with an embodiment of the present invention.

Now referring to FIG. 4, a cross-sectional view of flip chip integrated circuit 300B of FIG. 3B taken along AB axis is illustrated. On the top surface of first plurality of finger shaped structures 311A, high-side DMOS switch 310A has a top surface 310T and a bottom surface 310B. In lead frame structure 301 of the present invention, high-side DMOS switch 310A is inverted with top surface 310T faced down and bonded with lead frame 301 by means of flip chip bumps $411A_1$ and $411A_2$. In second section 329, on the top surface of fourth plurality of finger shaped structures 323B, low-side DMOS switch 320A includes a top surface 320T and a bottom surface 320B. Low-side DMOS switch 320A is inverted with top surface 320T faced down and bonded with lead frame 301 by means of flip chip bumps $423B_1$ and $423B_2$.

Figure 5:
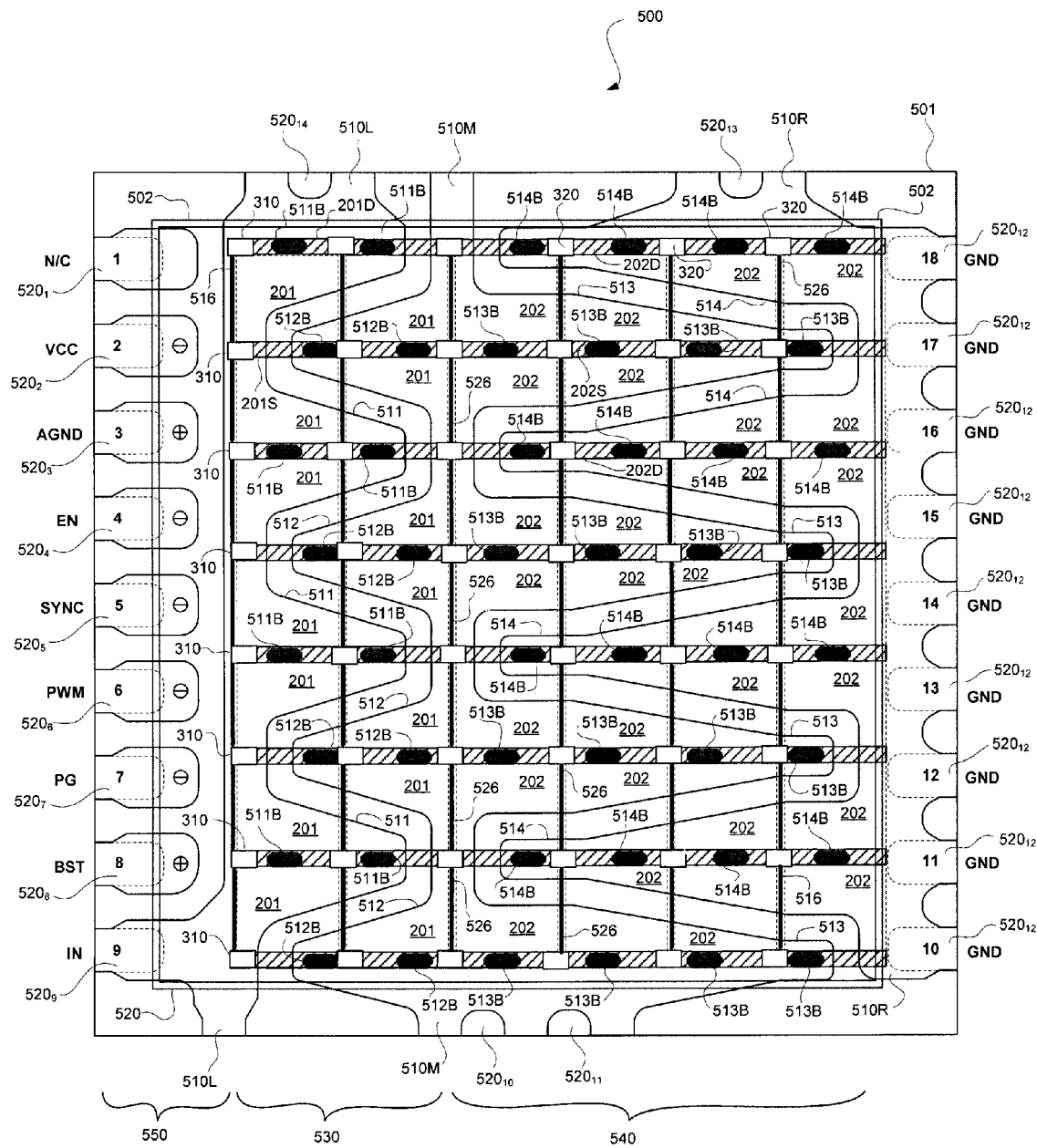
FIG. 5 illustrates the top plan view of an exemplary semiconductor device having single-die lead frame structure configuration that supports the switch-mode voltage regulator circuit of FIG. 3A in accordance with an embodiment with the present invention.

Now referring to FIG. 5, a plan view layout of a single-die configuration of switch-mode voltage regulator circuit 300A is illustrated. Switch-mode voltage regulator integrated circuit 500 includes a lead frame structure 501 and a semiconductor die 502. Lead frame structure 501 having a single die configuration is the same as lead frame structure 301 except that lead frame structure 501 includes only one die. Lead frame structure 501 has three main sections: a first section 510L, a second section 510M, and a third section 510R. First section 510L includes a electrical leads $520_1$-$520_9$ on the bottom, an electrical lead 52014 on the top, and a first plurality of finger shaped structures 511. Second section 510M includes electrical leads $520_{10}$-$520_{11}$, a second plurality of finger shaped structures 512, and a third plurality of finger shaped structures 513. Finally, third section 510R of lead frame structure 501 includes a fourth plurality of finger shaped structures 514, electrical leads $520_{12}$ on the side, and an electrical lead $520_{13}$ on the top. In one embodiment, semiconductor flip chip die 502 is partitioned into a first section 530 for a high side array of switching elements 201, a second section 540 for a low side array of switching elements 202, and a third section 550 is dedicated for peripheral circuitry (not shown). On first section 530, each switching element 201 includes a plurality of fundamental transistors (not shown) laid out parallel to one another, a drain power bus 201D, a gate poly line 516, and a source power bus 201S. Within each switching element 201, drain power bus 201D connects all the drains of plurality of fundamental transistors together. A flip chip bump 511B is placed on each drain power bus 201D for bonding with first plurality of finger shaped structures 511. Similarly, source power bus, located on the opposite side of switching element 201, connects all the sources of plurality of fundamental transistors together. A flip chip bump 512B is placed on each source power bus 201S for bonding with a second plurality of finger shaped structures 512. Gate poly line 516 connects all the gates of plurality of fundamental transistors together. A gate driver circuit 310, connected to gate poly line 516, is dedicated to drive each switching element 201.

Continuing with FIG. 5, on second section 540, each switching element 202 includes a plurality of fundamental transistors (not shown) laid out parallel to one another, a drain power bus 202D, a gate poly line 526, and a source power bus 202S. Within each switching element 202, drain power bus 202D connects all the drains of plurality of fundamental transistors together. A flip chip bump 513B is placed on each drain power bus 202D for bonding with a third plurality of finger shaped structures 513. Similarly, source power bus 202S, located on the opposite side of switching element 202, connects all the sources of plurality of fundamental transistors together. A flip chip bump 514B is placed on each source power bus 202S for bonding with a fourth plurality of finger shaped structures 514. Gate poly line 526 connects all the gates of plurality of fundamental transistors together. A gate driver circuit 320, connected to gate poly line 526, is dedicated to drive each switching element 202. In one embodiment, gate driver circuits 310 for high-side and gate driver circuits 320 for second section 540 can be fabricated by a similar fabrication process. Furthermore, high side switching element 201 and low side switching element 202 are similar and can be fabricated by the same fabrication process. However, it is noted that different structures and fabrication processes can be used between switching elements 201, gate driver circuits 310 in high side 530 and for switching elements 202 and gate driver circuits 320 in low side 540, which is within the scope of the present invention.

Furthermore, lead frame structure 500 is encapsulated into a quad flat leadless (QFN) while lead frame structure 300B is a dual flat leadless frame (DFN). In particular, the single-die configuration of lead frame structure 501 includes electrical leads $520_1$-$520_{14}$ for communication between semiconductor flip chip die 502 and external circuitry. Third section 550 is dedicated for peripheral circuitry such as boot strap charging circuit, band gap circuit, supply voltage regulator circuit, etc.

Figure 6A:
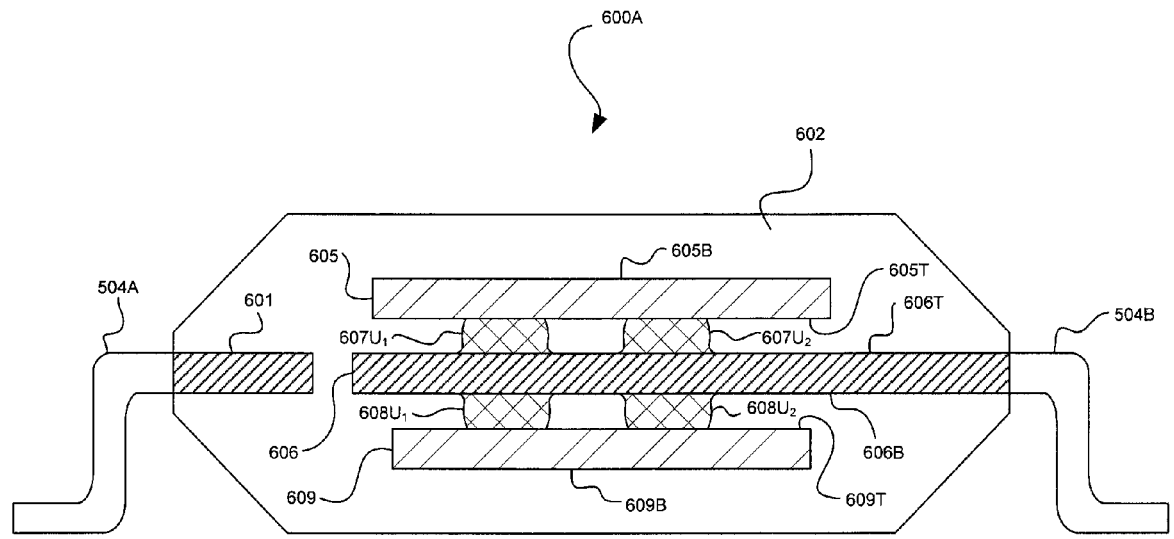
FIG. 6A illustrates a cross-sectional view of a vertically stacked two-die lead frame structure configuration of a leaded semiconductor device that implements the exemplary switch-mode voltage regulator circuit of FIG. 3A in accordance with an embodiment with the present invention.
Figure 6B:
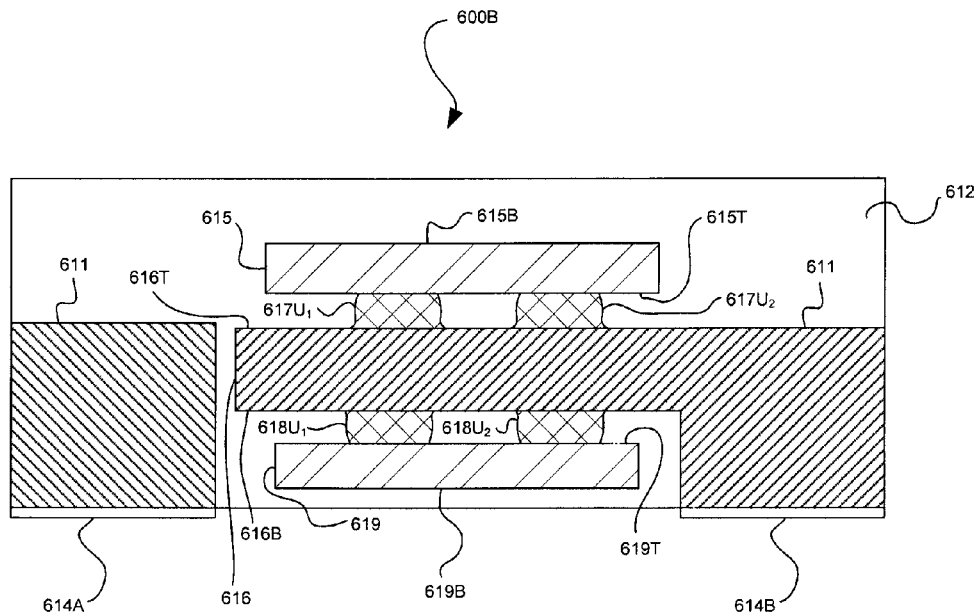
FIG. 6B illustrates a cross-sectional view of a vertically stacked two-die lead frame structure configuration of a leadless semiconductor device that implements the exemplary switch-mode voltage regulator circuit of FIG. 3A in accordance with an embodiment with the present invention.

FIG. 6A and FIG. 6B show other embodiments of the multi-chip lead frame package in accordance with the present invention where the dies are vertically stacked.

Now referring to FIG. 6A, a cross-sectional view of a semiconductor device 600A that has two dies vertically stacked and bonded onto both sides of a leaded lead frame structure in accordance with one embodiment with the present invention is illustrated. In this leaded configuration, a molding material 602 only encapsulates only part of a first plurality of finger shaped structures (not shown) and a second plurality of finger shaped structures 606 that extend outward bilaterally from molding material 602 to become leaded first electrical lead 604A and second leaded electrical leaded 604B respectively. More particularly, second plurality of finger shaped structures 606 includes a top surface 606T and a bottom surface 606B. On top surface 606T, a first semiconductor flip chip die 605 is attached to lead frame structure 601 by means of flip chip bumps $607U_1$ and $607U_2$. To be more specific, first semiconductor flip chip die 605 includes a top surface 605T and a bottom surface 605B. In the embodiment of the present invention, first semiconductor flip chip die 605 is inverted so that top surface 605T having flip chip bumps $607U_1$ and $607U_2$ is faced down to bond with top surface 606T of second plurality of finger shaped structure 606. Consequently, first semiconductor flip chip die 605 is bonded to second plurality of finger shaped structure 606 by flip chip bumps $607U_1$ and $607U_2$. On bottom surface 606B, a second semiconductor flip chip die 609 is attached to second plurality of finger shaped structures 606 by means of flip chip bumps $608U_1$ and $608U_2$. More particularly, second semiconductor flip chip die 609 includes a top surface 609T and a bottom surface 609B. In the embodiment of the present invention, second semiconductor flip chip die 609 having $608U_1$ and $608U_2$ is inverted so that top surface 609T is faced toward bottom surface 606B of second plurality of finger shaped structure 606. As such, second semiconductor flip chip die 609 is bonded to finger shaped structure 606 by flip chip bumps $608U_1$ and $608U_2$. First plurality of finger shaped structure attached to first electrical lead 604A is not shown because it is hidden behind second plurality of finger shaped structure 606. After first semiconductor flip chip die 605 and second semiconductor flip chip die 509 are bonded to the top and the bottom of lead frame structure 601, molding material 602 is used to encapsulate the entire package. In one embodiment of the present invention, molding material 602 of excellent thermal and electrical characteristics is used. Lead frame structure 601 is a leaded lead frame structure such as small outline package (SOP), shrink small outline package (SSOP) and thin shrink small outline package (TSSOP), or any suitable package types.

Now referring to FIG. 6B, a cross-sectional view of a semiconductor device 600B that has dual dies vertically stacked and bonded onto both sides of a leadless lead frame structure 611 in accordance with an embodiment with the present invention is illustrated. In this leadless configuration, lead frame structure 611 supports a first semiconductor flip chip die 615 and a second semiconductor flip chip die 619 that are vertically stacked together. That is, a second plurality of finger shaped structure 616 includes a top surface 616T and a bottom surface 616B. Top surface 616T adapted for first semiconductor flip chip die 615 to be attached to lead frame 611 by means of flip chip bumps $617U_1$ and $617U_2$. More particularly, first semiconductor flip chip die 615 includes a top surface 615T and a bottom surface 615B. In the embodiment of the present invention, first semiconductor flip chip die 615 having flip chip bumps $617U_1$ and $617U_2$ is inverted so that top surface 615T is faced down toward top surface 616T of second plurality of finger shaped structures 616. As such, first semiconductor flip chip die 615 is bonded to second finger shaped structures 616 by flip chip bumps $617U_1$ and $617U_2$. Second semiconductor flip chip die 619 is attached to bottom surface 616B by flip chip bumps $618U_1$ and $618U_2$. More particularly, second semiconductor flip chip die 619 includes a top surface 619T and a bottom surface 619B. In the embodiment of the present invention, second semiconductor die 619 is inverted so that top surface 619T is faced toward bottom surface 616B of second plurality of finger shaped structure 616. Second semiconductor flip chip die 619 is bonded to second plurality of finger shaped structure 616 by flip chip bumps $618U_1$ and $618U_2$. First plurality of finger shaped structures attached to a first electrical lead 613A is not shown because it is hidden behind a second plurality of finger shaped structure 616. Both first plurality of finger shaped structures 613 and second plurality of finger shaped structures 616 are exposed at the bottom surface areas after encapsulation to form first leadless electrical contact 614A and second leadless electrical contact 614B respectively. After first semiconductor flip chip die 615 and second semiconductor flip chip die 619 are bonded to the top and the bottom of lead frame structure 611, a molding material 612 is used to encapsulate the entire leadless package. In one embodiment, lead frame structure 611 is a leadless lead frame structure such as leadless dual flat (DFN), quad flat (QFN), or any suitable package types.

Figure 7:
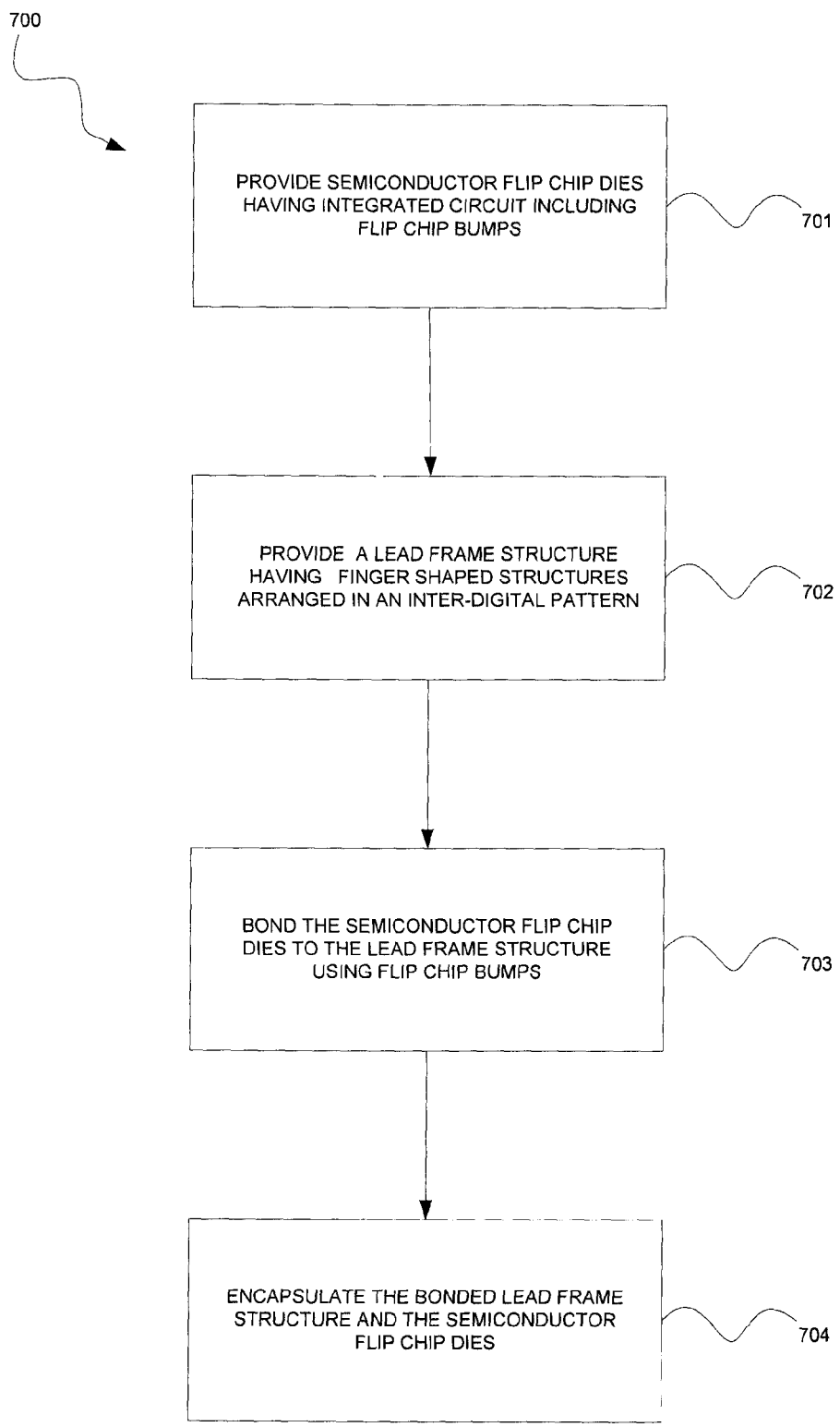
FIG. 7 illustrates a flow chart of a process for making a semiconductor device that has low interconnection resistance and capability of handling high current in accordance with an embodiment of the present invention.

Now referring to FIG. 7, a process 700 for making a semiconductor device that has low interconnection resistance and capability of handling large current is illustrated. Process 700 includes steps of providing semiconductor flip chip dies each having an integrated circuit, providing a lead frame structure having a plurality of electrical leads each having a plurality of finger shaped metal structures arranged in an inter-digital pattern where the semiconductor flip chip dies are placed, and bonding the semiconductor dies to the lead frame structure.

Now referring to step 701, semiconductor flip chip dies including a preformed high power integrated circuit are provided. More particularly, step 701 can be implemented by semiconductor flip chip dies each having an array of flip chip bumps electrically coupled to semiconductor circuitry such as low-side array of DMOS switch 201 and high-side array of DMOS switch 202 are provided. In one embodiment, low-side DMOS switch 202, gate circuit driver 326, high-side DMOS switch 201, and gate driver circuit 316 are integrated together on the same semiconductor die. Each switching element 201 or 202 contains a large number of fundamental DMOS transistors that are laid out in parallel to one another as discussed in detail in FIG. 5.

Next, referring to step 702, a lead frame structure comprised of at least two finger shaped structures arranged in inter-digital patterns where semiconductor dies of step 601 are received are provided. Step 702 is implemented by an exemplary lead frame structure 101 as shown in FIG. 1. In FIG. 1, first plurality of finger shaped structures 106A and second plurality of finger shaped structures 106B are arranged in the inter-digital pattern where a semiconductor die is bonded. Exemplary single chip configuration of lead frame structure 501 is shown in FIG. 5. Exemplary two-chip configuration of the lead frame structure can also be obtained by step 702 which are shown in FIG. 3B, FIG. 4, FIG. 6A, and FIG. 6B. In FIG. 3B and FIG. 4, a lateral layout of two chip configuration is placed on leadless lead frame is also achieved by step 702. FIG. 6A shows a leaded stacked version of lead frame structure of step 702, while FIG. 6B shows a leadless embodiment.

Referring to FIG. 703, semiconductor flip chip dies are bonded to lead frame structure produced by step 602. In an embodiment of the present invention, the semiconductor flip chip dies achieved by the process of step 701 are flipped over face down so that the flip chip bumps (e.g., $210B_1$, $210B_2$, $411A_1$, $411A_2$, $423B_1$, $423B_2$, etc.) are placed on the contact pads of finger shaped structures. The flip chip bumps are then reflowed so that semiconductor dies are bonded to the lead frame.

Finally, referring to FIG. 704, the bonded flip chip semiconductor flip chip dies and the lead frame is encapsulated in a molding material. The molding material is selected to have good thermal and electrical characteristics. Process 700 result in semiconductor devices of FIG. 1, FIG. 2, FIG. 3B, FIG. 4, FIG. 5, FIG. 6A, and FIG. 6B.

Thus, the present invention provides a package the meets very low interconnection resistance and optimal heat flow properties for semiconductor devices, especially high power integrated circuitry, in a chip scale package with superior thermal performance. The packaging concept in accordance with the present invention conforms to a chip scale definition whose package size is 1.8 times its chip size. The lead frame is designed such that it helps the chip to handle large current and reduces interconnection layers.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A lead frame structure, providing both mechanical support and means for electrical communication between at least one semiconductor die and external circuitry, comprising:

at least two electrical leads, each of said electrical leads having a plurality of finger shaped structures extended unilaterally outward therefrom, wherein said at least two electrical leads are arranged so that, from a top plan view, said plurality of finger shaped structures forms inter-digital patterns where said at least one semiconductor die is attached to said lead frame structure, wherein said at least two electrical leads comprise a first electrical lead, a second electrical lead, and a third electrical lead, wherein said plurality of finger shaped structures further comprises a first plurality of finger shaped structures, a second plurality of finger shaped structures, a third plurality of finger shaped structures, and a fourth plurality of finger shaped structures and wherein:

said first electrical lead including said first plurality of finger shaped structures extending unilaterally outward therefrom;

said second electrical lead coupling to said second plurality of finger shaped structures and said third plurality of finger shaped structures, said second plurality of finger shaped structures extended unilaterally outward from one side of said second electrical lead, said third plurality of finger shaped structures extended unilaterally outward from the opposite side of said second electrical lead; and said third electrical lead coupling to said fourth plurality of finger shaped structures extending unilaterally outward therefrom, said second electrical lead, and said third electrical lead are juxtaposed next to one another so that said first plurality of finger shaped structures and said second plurality of finger shaped structures form a first inter-digital pattern where a first semiconductor die is bonded to said lead frame structure, and so that said third plurality of finger shaped structures and said fourth plurality of finger shaped structures form a second inter-digital pattern where a second semiconductor is bonded to said lead frame structure.

2. The lead frame structure of claim 1 further comprises a set of input/output (I/O) electrical leads for electrically coupling said at least one semiconductor die to external circuitry.

3. The lead frame structure of claim 1 wherein said at least one semiconductor die is a semiconductor flip chip die having a plurality of flip chip bumps, said semiconductor flip chip die is flip chip bonded to said lead frame structure on said inter-digital patterns by said plurality of flip chip bumps.

4. The lead frame of claim 1 wherein said at least one electrical lead and said plurality of finger shaped structures comprise a copper (Cu) material.

5. The lead frame of claim 1 wherein each of said plurality of finger shaped structures has a width tapering off from the side where each of said plurality of finger shaped structure is originated from said at least one electrical leads.

6. The lead frame of claim 1 wherein each of said plurality of finger shaped structures has a constant width.

7. The lead frame structure of claim 1 wherein said first semiconductor die and said second semiconductor die are semiconductor flip chip dies attached to said lead frame structure by means of flip chip bumps.

8. A method of making a flip chip device, comprising:
providing at least one semiconductor flip chip die each having integrated circuitry coupling to a plurality of flip chip bumps;
providing a lead frame structure providing both mechanical support and means for electrical communication between said at least one semiconductor flip chip die and external circuitry, and having at least two electrical leads and a plurality of finger shaped structures that extend unilaterally outward from said at least two electrical leads so as to form, from a top plan view, inter-digital patterns where said at least one semiconductor flip chip die is flip chip attached thereto, wherein said at least two electrical leads comprise a first electrical lead, a second electrical lead, and a third electrical lead, wherein said plurality of finger shaped structures further comprises a first plurality of finger shaped structures, a second plurality of finger shaped structures, a third plurality of finger shaped structures, and a fourth plurality of finger shaped structures and wherein:

said first electrical lead including said first plurality of finger shaped structures extending unilaterally outward therefrom;

said second electrical lead coupling to said second plurality of finger shaped structures and said third plurality of finger shaped structures, said second plurality of finger shaped structures extended unilaterally outward from one side of said second electrical lead, said third plurality of finger shaped structures extended unilaterally outward from the opposite side of said second electrical lead; and said third electrical lead coupling to said fourth plurality of finger shaped structures extending unilaterally outward therefrom, said second electrical lead, and said third electrical lead are juxtaposed next to one another so that said first plurality of finger shaped structures and said second plurality of finger shaped structures form a first inter-digital pattern where a first semiconductor die is bonded to said lead frame structure, and so that said third plurality of finger shaped structures and said fourth plurality of finger shaped structures form a second inter-digital pattern where a second semiconductor is bonded to said lead frame structure; and bonding said at least one semiconductor flip chip die to said lead frame on said inter-digital patterns using said plurality of flip chip bumps.

9. The method of claim 8 further comprises encapsulating said at least one semiconductor die and said lead frame structure with a molding material.

10. The method of claim 8 wherein said providing a lead frame structure further comprises providing a plurality of input/output electrical leads for receiving electrical signals from external circuitry.

* * * * *